(12) United States Patent
Kuehn

(10) Patent No.: US 7,924,105 B2
(45) Date of Patent: Apr. 12, 2011

(54) METHOD FOR THE DETECTION OF A PREDAMPING STATE AND INDUCTIVE SENSOR WITH PREDAMPING DETECTION

(75) Inventor: Thomas Kuehn, Mannheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 97 days.

(21) Appl. No.: 12/398,213

(22) Filed: Mar. 5, 2009

(65) Prior Publication Data

US 2009/0224841 A1 Sep. 10, 2009

(30) Foreign Application Priority Data

Mar. 6, 2008 (EP) .................................... 08004168

(51) Int. Cl.
*H03K 17/95* (2006.01)
*G01B 7/14* (2006.01)

(52) U.S. Cl. ................ 331/65; 324/207.15; 324/207.16; 324/207.26

(58) Field of Classification Search .................... 331/65, 331/66; 324/207.12, 207.15, 207.16, 207.26
See application file for complete search history.

(56) References Cited

U.S. PATENT DOCUMENTS

| | | | | |
|---|---|---|---|---|
| 4,553,040 A | * | 11/1985 | Truper et al. ................. | 307/116 |
| 4,673,827 A | * | 6/1987 | Sommer ....................... | 307/116 |
| 4,987,366 A | * | 1/1991 | Hamel ......................... | 324/207.26 |
| 5,504,425 A | * | 4/1996 | Fericean et al. .......... | 324/207.16 |
| 5,811,893 A | * | 9/1998 | Soyck ............................ | 307/116 |
| 6,342,805 B1 | | 1/2002 | Chen | |
| 7,173,411 B1 | | 2/2007 | Pond | |
| 7,274,189 B2 | * | 9/2007 | Chen et al. ................ | 324/207.26 |

FOREIGN PATENT DOCUMENTS

EP 0 304 272 A2 2/1989
WO WO 00/43728 7/2000

OTHER PUBLICATIONS

European Search Report, Application No. EP 08 00 4168, Completion Date Oct. 2, 2008.

* cited by examiner

*Primary Examiner* — Robert Pascal
*Assistant Examiner* — Levi Gannon
(74) *Attorney, Agent, or Firm* — John A. Merecki; Hoffman Warnick LLC

(57) ABSTRACT

The present invention relates to a method for the detection of a predamping state of an inductive sensor. The sensor has at least one oscillator with a resonant circuit and an oscillation amplifier. According to the method the oscillatory response of the oscillator is analyzed with an operating amplification or gain. According to the invention the method is further developed in that the oscillatory behavior of the oscillator is additionally analyzed for an analysis amplification or gain, which is chosen lower than the operating amplification. The analysis amplification is also chosen in such a way that the oscillatory response of the oscillator reacts sensitively to objects or articles located in close proximity to the sensor. The invention also relates to an inductive sensor with predamping detection.

12 Claims, 3 Drawing Sheets

METHOD FOR THE DETECTION OF A PREDAMPING STATE AND INDUCTIVE SENSOR WITH PREDAMPING DETECTION

FIELD OF THE INVENTION

According to a first aspect, the present invention relates to a method for the detection of a predamping state of an inductive sensor. In a second aspect, the invention relates to an inductive sensor, particularly a proximity switch, with predamping detection.

RELATED ART

Inductive proximity switches are equipped with an oscillator, which has a resonant circuit and an oscillation amplifier. In addition inductive proximity switches have an evaluating and control device. The evaluating and control device analyzes the oscillatory response or behaviour of the oscillator. The oscillator or its resonant circuit is influenced by the presence of objects, particularly metallic objects, so that there is a change to the oscillatory response. Dependent on the change to the oscillatory response, conclusions can be drawn as to whether an object, a so-called target, is located in the vicinity of the proximity switch.

A switching distance is defined, which indicates the distance of the target from the proximity switch, where the switch indicates the presence of the target. This is, e.g., detected in accordance with a threshold value during the analysis of the oscillatory response of the oscillator.

So-called predamping can cause a problem in connection with the installation and operation of such inductive proximity switches. Predamping is understood to mean all undesired damping effects on the proximity switch or its oscillator. This, e.g., relates to metallic objects in close proximity to the oscillator, as well as the structure of materials surrounding the inductive proximity switch. In principle, it is difficult or impossible to distinguish whether a change to the oscillatory response occurs as a result of predamping or because the target is in the vicinity of the inductive proximity switch.

In the case of damping arising as a result of the aforementioned exemplary objects being in close proximity to the oscillator, use is made of the term predamping, because the damping takes place independently of a target.

Normally an inductive proximity switch detects the presence of a target in that there is a rise above or drop below a specific threshold when analyzing the oscillatory response. This response is influenced by the overall damping. Thus, as a function of the degree of damping the inductive proximity switch decides whether a target is or is not located in the target area. If predamping is present, the necessary total damping amount triggering a switching signal is already partly present, so that a weaker damping by the target is sufficient for triggering a switching signal. This means that a target at a greater distance from the sensor, i.e., with an increased switching distance, triggers a switching signal indicating the presence of a target.

The described effects lead to an undesired rise in the switching distance of an inductive proximity switch.

Another problem arises in that the oscillator and the resonant circuit provided therein are temperature-dependent. With the combination of predamping and temperature drift in unfavourable cases there can be a failure of the inductive sensor, because the latter detects a so-called permanent damping, i.e., permanently indicates the presence of a target, independently of whether a target is present or not.

Users of such sensors, e.g., require that for a switching distance of 12 mm the switching distance drift must be max. ±10%. In a preset temperature range of −25° C. to +70° C. this can be achieved by corresponding measures. If there is a predamping with such an inductive proximity switch so that the switching distance has, e.g., increased to 20 mm, the temperature drift becomes more marked, so that the aforementioned permanent damping can arise.

It is therefore desirable to detect a misdamping state.

SUMMARY OF THE INVENTION

It is an object of the invention to provide a method for the detection of a predamping state of an inductive sensor, which is usable both with decreased and also increased switching distances. Moreover an inductive sensor is to be provided in which predamping can be detected.

In a first aspect of the invention, the present invention provides a method for the detection of a predamping state of an inductive sensor which has an oscillator with a resonant circuit and an oscillation amplifier, in which the oscillatory response of the oscillator is analyzed with an operating amplification of the oscillation amplifier and wherein the oscillatory response of the oscillator is analyzed with at least one analysis amplification of the oscillation amplifier, the at least one analysis amplification is chosen lower than the operating amplification and the at least one analysis amplification of the oscillation amplifier is chosen in such a way that the oscillatory response of the oscillator reacts sensitively to objects located in the vicinity of the inductive sensor and which predamp the sensor.

In a further aspect, the present invention provides an inductive sensor with predamping detection, with an oscillator having a resonant circuit and an oscillation amplifier, with an evaluating and control device for analyzing the oscillatory response of the oscillator, the oscillation amplifier being designed for amplification with an operating amplification, wherein the oscillation amplifier is designed for amplification with at least one analysis amplification, the evaluating and control device is set up for detecting a predamping state by analyzing the oscillatory response of the oscillator with an operating amplification and with at least one analysis amplification, the at least one analysis amplification is lower than the operating amplification and the at least one analysis amplification of the oscillator is chosen in such a way that the oscillatory response of the oscillator reacts sensitively to objects located in close proximity to the inductive sensor and which predamp the latter.

According to the invention the known method is further developed in that the oscillatory response of the oscillator, in addition to the analysis with an operating or working amplification or gain, is also analyzed with at least one analysis amplification or gain of the oscillation amplifier. The analysis amplification or amplifications are chosen lower than the working amplification. In addition, the analysis amplification or amplifications of the oscillation amplifier are chosen in such a way that the oscillatory response of the oscillator reacts sensitively to articles and objects in close proximity to the sensor and which predamp the latter.

It is a fundamental concept of the invention that the oscillator of an inductive sensor, particularly an inductive proximity switch, is operated with an analysis amplification. The analysis amplification is lower than the normal operating or working amplification used in the detection of a target. During the operation of the oscillator with the analysis amplification, the oscillatory response of the oscillator is again investigated. If the oscillator also oscillates at the lower analysis amplification, it can be concluded that there is little or no predamping. The analysis amplification is chosen in such a way that it can indicate a critical state of the predamping. The critical state is, e.g., that in which by additional variations of components of the sensor there would be an unreliable detection as a result of temperature changes.

When using several analysis amplifications it is, e.g., possible to adjust them in such a way that the evaluation of a first analysis amplification indicates whether there is a critical predamping state which must be immediately modified, because there is no longer an adequate detection precision. The evaluation in the case of the second analysis amplification can, e.g., provide the result that although a predamping exists it is not sufficiently critical that it must be immediately modified. In this case the second analysis amplification would be chosen stronger than the first analysis amplification. Hereinafter reference is fundamentally made to an analysis amplification. However, according to the invention this can also be understood to mean the use of several different analysis amplifications.

During the operation of the oscillator with analysis amplification it is not possible to obtain reliable information regarding the presence of a target. It is therefore preferable if at least for a time interval there is a cyclic switching between the operation of the oscillator amplifier with operating amplification and analysis amplification. This can bring about both the normal operating state of the inductive sensor in which the presence or absence of a target is detected with operating amplification, and also with analysis amplification indicates a possible predamping. This predamping can also be modified with installed and set up sensors, e.g., as a result of new components fitted close to the sensor. It is fundamentally also possible to operate the sensor solely with analysis amplification, e.g., during sensor installation and positioning in order to be able to detect and improve already in this state unfavourable predamping conditions. When final installation has occurred operation takes place with operating amplification.

Within the framework of the analysis of the oscillatory response of the oscillator it is, e.g., possible to evaluate the frequency, maximum amplitude, the course of the amplitude or similar significant quantities of an oscillation. In the case of the present method, it is already adequate if detection takes place as to whether or not an oscillator oscillates. Thus, with a non-oscillation of the oscillator with an operating amplification of the oscillation amplifier it can be concluded that a target is present, which is at a shorter distance from the sensor compared with the switching distance and correspondingly a switching signal is emitted. However, this conclusion is only valid if there is no predamping, which can be checked by means of the inventive method.

The presence of a predamping state can also be determined solely by means of the oscillation state of the oscillator. Thus, a predamping signal is emitted if during analysis amplification the oscillator does not oscillate, but does oscillate with an operating amplification. It can be concluded from this that no target is in the vicinity, because the oscillator oscillates during operating amplification. However, as it does not oscillate during analysis amplification, it is to be assumed that it is predamped to a critical extent.

The analysis of the oscillatory response of the oscillator can be carried out directly following the start of operation of the oscillation amplifier with either operating amplification or analysis amplification. However, to give the oscillator the possibility of setting to the new amplification, in order to, e.g., achieve a quasi-stationary state of the oscillations, it is advantageous if following switching between operating amplification and analysis amplification and vice versa there is a clearly defined delay prior to the analysis of the oscillatory response. This also applies with switching between different analysis amplifications. The defined delay, which can also be referred to as waiting time or waiting time interval, cam be chosen as a function of the oscillator dynamics. The waiting time interval following switching from operating to analysis amplification can differ from the waiting time interval following switching from analysis to operating amplification.

A particularly reliable detection of a predamping state of an inductive proximity switch occurs if successively the following method steps are performed:

Step 1 Operation of the oscillation amplifier with operating amplification.

Step 2 Analysis of the oscillatory response of the oscillator with operating amplification of the oscillation amplifier.

Step 3 Setting a switching signal if the oscillator does not oscillate during operating amplification of the oscillation amplifier and return to step 2.

Step 4 Operating the oscillation amplifier with analysis amplification if the oscillator oscillates during operating amplification.

Step 5 Analysis of the oscillatory response of the oscillator with analysis amplification of the oscillation amplifier.

Step 6 Setting a predamping signal if the oscillator does not oscillate during analysis amplification of the oscillation amplifier.

Step 7 Return to step 1.

Additionally and taking account of the waiting time intervals they can be introduced in the form of a step 1a following step 1 and a step 4a following step 4. The waiting time intervals of steps 1a and 4a need not be the same.

When performing the aforementioned method steps, in step 3 it can be concluded from a non-oscillation of the oscillator that a strongly damped state of the inductive proximity switch is involved. As a result it is concluded a target is present, because a predamping state is detected through the following steps and has if necessary been stopped. Thus in step 5 it can be concluded that there is a predamping state, because this step can only be reached if the oscillator oscillates during operating amplification, i.e., no target is present in the detection range. If the oscillator now does not oscillate during analysis amplification, the latter is not sufficiently strong to compensate the losses which occur and as is possible with operating amplification. Therefore it is concluded that predamping is present.

Such an inductive sensor can be inventively further developed in that the oscillation amplifier is designed for amplifying with at least one analysis amplification. In addition, the evaluating and control device is set up for detecting a predamping state by analyzing the oscillatory response of the oscillator during operating amplification and with at least one analysis amplification. The at least one analysis amplification is lower than the operating amplification and is selected in such a way that the oscillatory response of the oscillator reacts sensitively to objects located close to the sensor and which predamp the latter.

In an embodiment of the inductive sensor, the oscillation amplifier has a gain, which predetermines a steep amplitude characteristic for the resonant circuit. The advantage of this amplitude characteristic is that the switching distances are particularly well defined. As the inventive inductive sensor only detects a predamping state by analyzing the oscillatory response of the oscillator and where the analysis, e.g., takes place through tests as to whether or not the oscillator oscillates at two different gains, according to the invention a predamping state can also be detected with a steep amplitude characteristic.

To achieve a particularly reliable predamping state detection, it is advantageous for the oscillation amplifier to have essentially the same amplifier characteristic for operating amplification and analysis amplification. If there would be excessive differences between the amplifier characteristics, the conclusions such as the presence of a predamping state carried out through the analysis of the oscillator during analysis amplification, could not be directly and readily transferred to operating amplification. Corresponding conversions would then be necessary.

The waiting times described hereinbefore relative to the inventive method prior to the analysis of the oscillation state of the oscillator represent time intervals which should be kept as short as possible, because with respect thereto no information can be obtained regarding the predamping or presence of a target. The waiting times also slow down the general measuring process. One possibility for reducing the waiting times is to make the amplifier characteristic of the oscillation amplifier such that it aids an accelerated oscillating up of the oscillator. This can, e.g., be brought about in that it has a higher gain in the range in which the oscillator starts to oscillate with a small amplitude, so that the oscillator rapidly exceeds this range and passes rapidly into the desired quasi-stationary state.

An inductive sensor may have both a switching output and a predamping output in order to be able to indicate on separate channels the switching and presence of a predamping.

BRIEF DESCRIPTION OF THE DRAWINGS

The invention is described in greater detail hereinafter relative to an embodiment and the attached diagrammatic drawings.

DETAILED DESCRIPTION OF THE INVENTION

Figure 1:
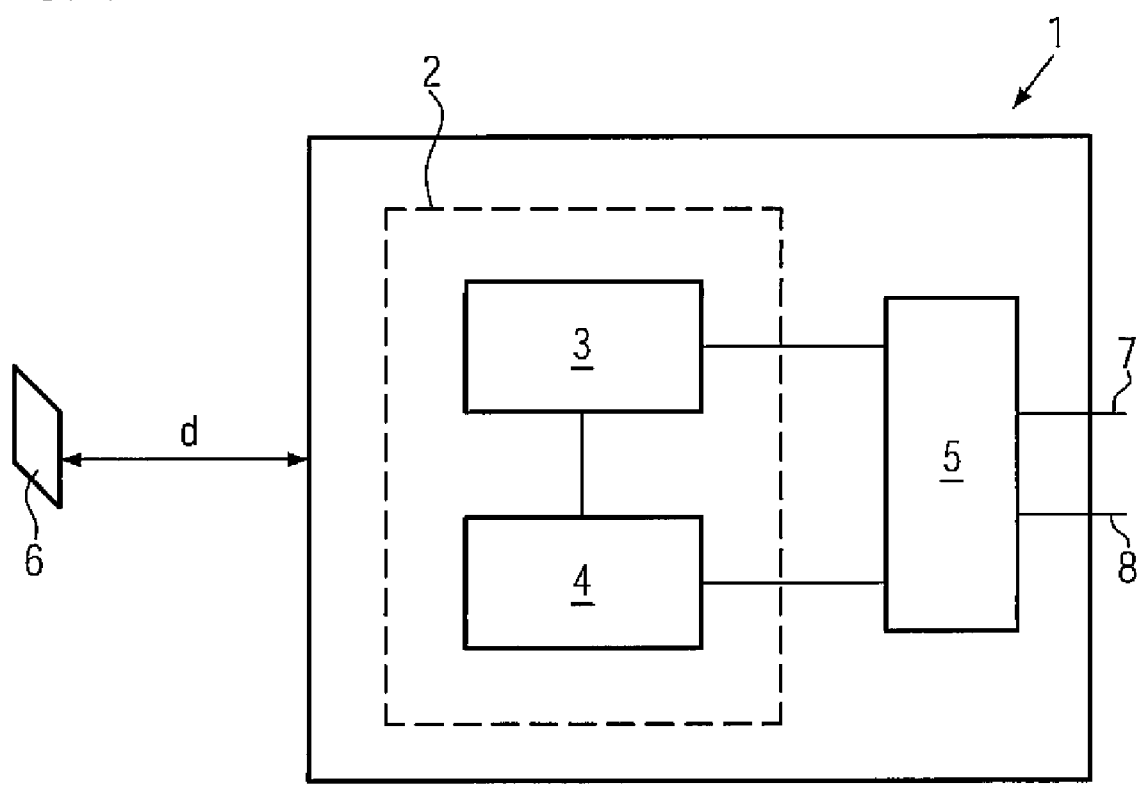
FIG. 1 depicts a diagrammatic representation of an inventive sensor.

FIG. 1 shows a sensor 1 in accordance with an embodiment of the invention. The sensor 1 has an oscillator 2, which comprises a resonant circuit 3 and an oscillation amplifier 4. The resonant circuit 3 can be excited by the oscillation amplifier 4. The exact construction of the resonant circuit 3 is irrelevant for the implementation of the invention and can be chosen as a function of the precise design of sensor 1.

The sensor 1 also has an evaluating and control unit 5 connected to the oscillation amplifier 4 and in the embodiment shown to the resonant circuit 3. The connection of the evaluating and control unit 5 to the resonant circuit 3 is optional. By means of the connection to the oscillation amplifier 4 the latter can be instructed regarding the gain by which it is to amplify oscillation in resonant circuit 3. By means of the connection to resonant circuit 3 the evaluating and control unit 5 can determine data regarding the oscillation, e.g., the frequency or amplitude and also makes it possible to establish whether the resonant circuit oscillates.

The evaluating and control unit 5 also has at least one switching output 7 and a predamping output 8. By means of the switching output 7 a signal is emitted if a target 6 to be detected is present. The predamping output 8 indicates that the sensor 1 is in a predamping state.

A target 6 is provided remote from sensor 1. If the distance between the target 6 and the sensor 1 drops below a specific value referred to as the switching distance $d_s$, this is detected by sensor 1 and indicates on its switching output 7 that there is a target 6 to be detected within the switching distance $d_s$.

Figure 2:
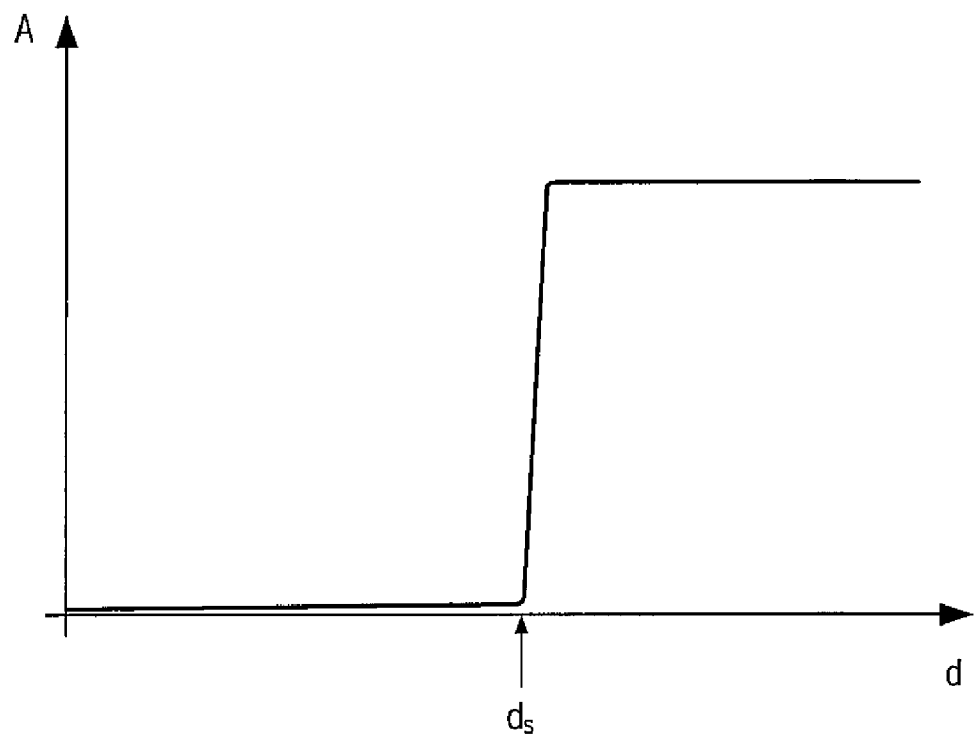
FIG. 2 depicts a diagrammatic representation of the response of an oscillation amplitude of an oscillator relative to the target distance.

FIG. 2 shows the desired response of the oscillation amplitude with respect to the distance of target 6 from sensor 1. The oscillation amplitude A is plotted over the distance d. The amplification or gain characteristic of the oscillation amplifier 4 can be set in such a way that it arrives at the amplitude response shown.

Figure 3:
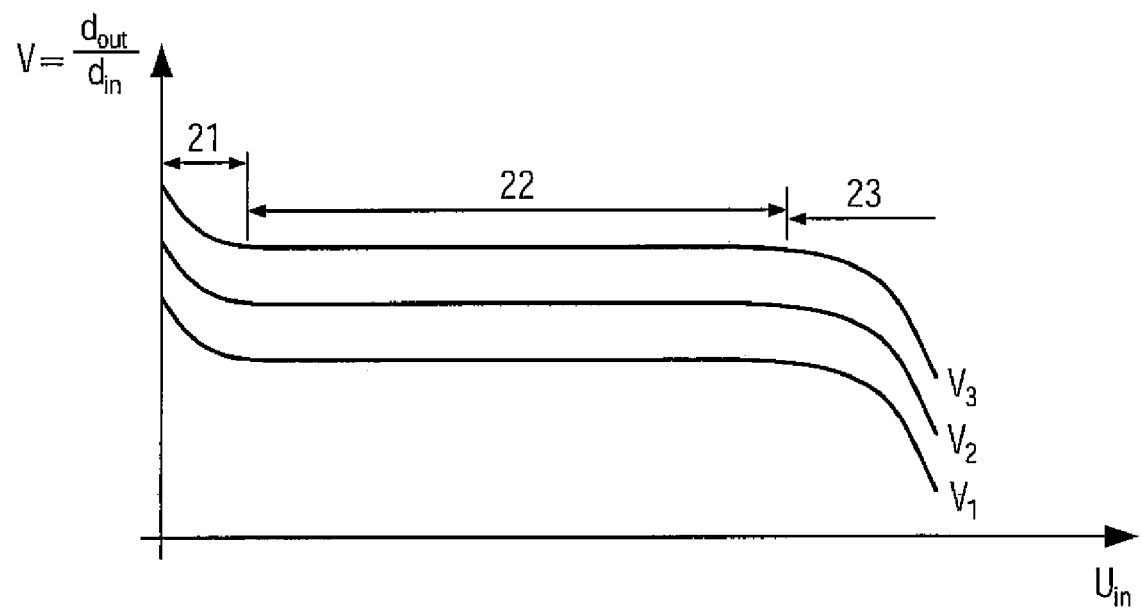
FIG. 3 depicts a diagrammatic representation of the course of different amplification or gain curves for an oscillation amplifier.

FIG. 3 diagrammatically shows three different courses for the oscillation gain, which are also referred to as oscillation amplifier characteristics. The input voltage $u_{in}$ at the input of oscillation amplifier 4 is shown relative to the gain, i.e., the ratio of the output voltage $u_{out}$ to the input voltage $u_{in}$. The course or path of a gain can be roughly subdivided into three areas 21, 22, 23. Area 22, which represents an extensive linearity area is used to show that even small changes in the input voltage $u_{in}$ lead to significant changes in the output voltage $u_{out}$. This linear area 22 leads to the abrupt amplitude jump if the target 6 passes above or drops below the switching distance $d_s$.

The gain is greater in area 21. Such an amplifier characteristic ensures that the oscillation of an oscillator 2 rapidly builds up and is rapidly brought into a quasi-stable oscillation state. Thus, the course represents a possibility for speeding up the oscillation build-up of oscillator 2. The gain drop in area 23 serves to limit the maximum amplitude of oscillator 2.

FIG. 3 shows in exemplified manner three different amplification or gain curves $v_1$, $v_2$, $v_3$, which in principle have a similar gain characteristic. The higher the gain in area 22, the higher can be the sensor damping without oscillator oscillation breaking down. This means that a higher gain is required for a small switching distance $d_s$. For example, the gain $v_3$ can be looked upon as the operating amplification or gain, whereas the gain $v_2$ and $v_1$ are merely used for predamping state analysis.

Figure 4:
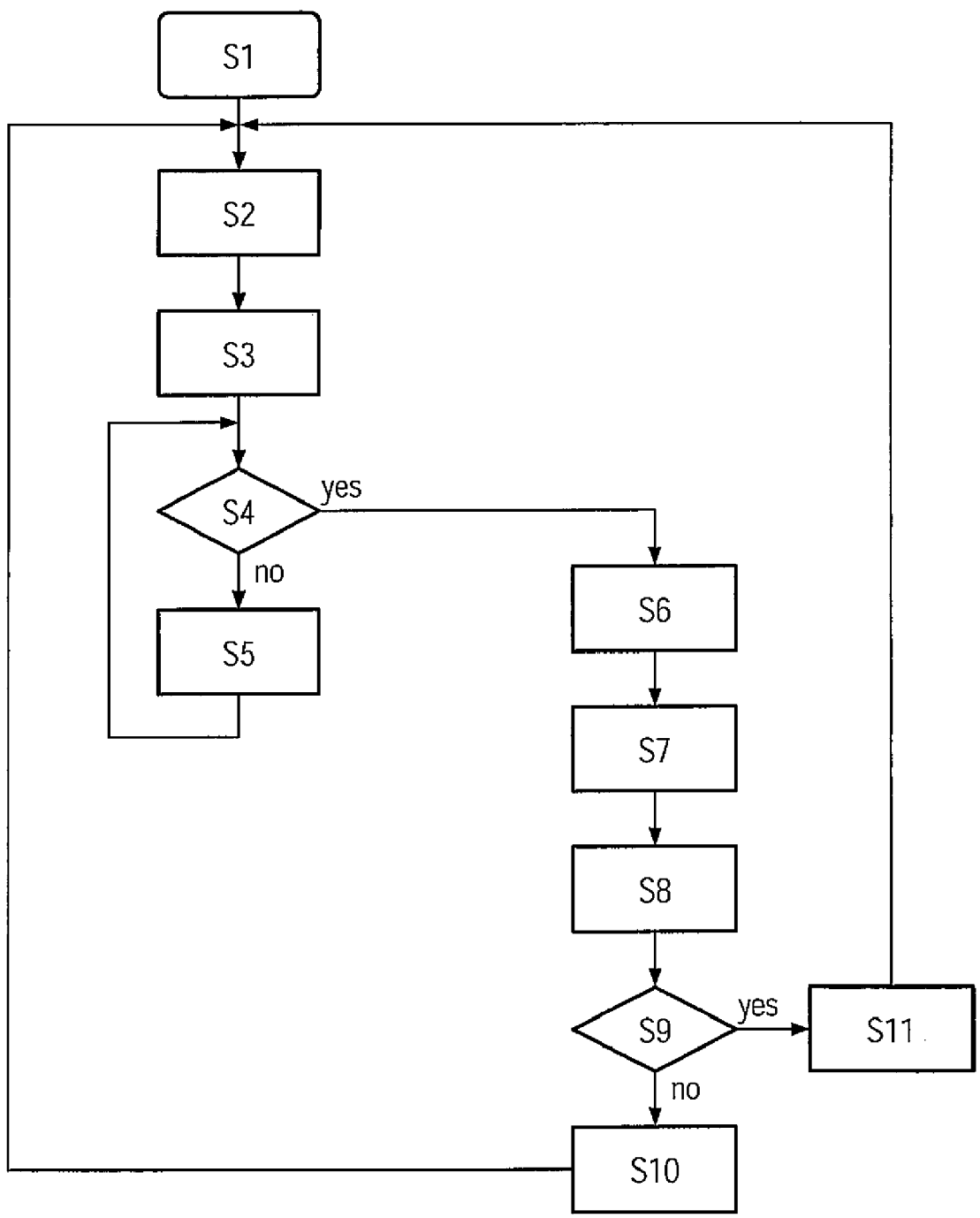
FIG. 4 depicts a diagrammatic flow chart of an inventive method.

An implementation of the inventive method will now be explained in greater detail relative to the data flow chart of FIG. 4. The inventive sensor 1 is initialized in step S1. Then in step S2 the oscillation amplifier 4 is, e.g., instructed by the evaluating and control unit 5 to operate the resonant circuit 3 with an operating gain. This operation can also be looked upon as the operation with a nominal gain of oscillation amplifier 4. This gain is, e.g., set up for a switching distance $d_s$ of 10 mm and the amplifier characteristic is optimized to the switching distance $d_s$.

Then, waiting takes place in step S3 until step S4 starts. This waiting time is dependent on the dynamics of oscillator 2 and is used for giving the latter time in order to enter a reliable, quasi-stable oscillation.

In step S4, it is established whether or not oscillator 2 oscillates. This investigation can, e.g., be carried out by the evaluating and control unit 5. If in step S4 it is detected that oscillator 2 does not oscillate on exciting with the operating amplification, it is concluded that there is a target 6 in the detection area or range. Thus, in step S5 the switching output 7 is set. The predamping output 8 can also be disconnected, because no information can be obtained regarding possible predamping in this state. It is also possible to provide a damping display showing the fundamental damping of sensor 1. This would be switched on with step S5, followed by a change to step S4 to again investigate an oscillation of oscillator 2.

However, if it is detected in step S4 that oscillator 2 oscillates, there is a transfer to step S6 in which the switching output 7 and the optionally provided damping display are set to OFF, which indicates that there is no damping and no target 6 is present in the detection area. The conclusion from the oscillation of oscillator 2 in step S4 is that there is no target in the detection area.

This is followed by steps S7 to S9 and S10 or S11 in order to check for the presence of predamping. In step S7 the gain of oscillation amplifier 4 is reduced, so that the oscillation amplifier 4 excites the resonant circuit 3 with an analysis amplification. The strength of the analysis amplification is set in such a way that it permits the detection of a critical predamping state. The setting can take place, e.g., when sensor 1 is installed, so that account can be taken of ambient variables.

Then in step S8 there is again a wait for a time interval, so that the resonant circuit 3 can be set to a stationary oscillation state.

Following step S8, in step S9 the oscillatory response of oscillator 2 is again analyzed. If oscillator 2 oscillates it is concluded that there is no predamping. Thus, in step S11 the predamping display is set to OFF. As opposed to this if the oscillator 2 does not oscillate in step S10 it is concluded that predamping is present and therefore the predamping display is switched to ON. Subsequently there is a change from step S10 or back to step S2 for the detection of the presence of a target 6.

Thus, the inventive method and device offer the possibility of detecting an undesired critical predamping state independently of the precise sensor design.

The invention claimed is:

1. Method for the detection of a predamping state of an inductive sensor which has an oscillator with a resonant circuit and an oscillation amplifier, in which an oscillatory response of the oscillator is analyzed with an operating amplification of the oscillation amplifier, and
    wherein
    the oscillatory response of the oscillator is analyzed with at least one analysis amplification of the oscillation amplifier,
    the at least one analysis amplification is chosen lower than the operating amplification,
    the at least one analysis amplification of the oscillation amplifier is chosen in such a way that the oscillatory response of the oscillator reacts sensitively to objects located in a vicinity of the inductive sensor and which predamp the inductive sensor, and
    a switching signal is emitted if the oscillator does not oscillate during operating amplification.

2. Method according to claim 1, wherein the inductive sensor is a proximity switch.

3. Method according to claim 1, wherein cyclic switching between the operation of the oscillation amplifier with operating amplification and analysis amplification takes place at least for a time interval.

4. Method according to claim 1, wherein a predamping signal is emitted if the oscillator does not oscillate during analysis amplification and oscillates during operating amplification.

5. Method according to claim 1, wherein analysis of the oscillatory response of the oscillator takes place following switching between operating amplification and analysis amplification and vice versa following a waiting time interval.

6. Method according to claim 5, wherein the waiting time interval is chosen as a function of oscillator dynamics.

7. Method according to claim 1, wherein successively the following method steps are performed:
    a) operating the oscillation amplifier with operating amplification,
    b) analyzing the oscillatory response of the oscillator with operating amplification,
    c) setting a switching signal if the oscillator does not oscillate at the operating amplification and return to step b),
    d) operating the oscillation amplifier with analysis amplification,
    e) analyzing the oscillatory response of the oscillator for analysis amplification of the oscillation amplifier,
    f) setting a predamping signal if the oscillator does not oscillate with analysis amplification, and
    g) return to step a).

8. Inductive sensor with predamping detection,
    with an oscillator having a resonant circuit and an oscillation amplifier,
    with an evaluating and control device for analyzing an oscillatory response of the oscillator,
    the oscillation amplifier being designed for amplification with an operating amplification,
    wherein
    the oscillation amplifier is designed for amplification with at least one analysis amplification,
    the evaluating and control device is set up for detecting a predamping state by analyzing the oscillatory response of the oscillator with the operating amplification and with the at least one analysis amplification,
    the at least one analysis amplification is lower than the operating amplification and
    the at least one analysis amplification of the oscillator is chosen in such a way that the oscillatory response of the oscillator reacts sensitively to objects located in close proximity to the inductive sensor and which predamp the inductive sensor, and
    the evaluating and control device is set up for emitting a switching signal if the oscillator does not oscillate during operating amplification.

9. Inductive sensor according to claim 8, wherein the inductive sensor is a proximity switch.

10. Inductive sensor according to claim 8, wherein the oscillation amplifier has a gain presetting a steep amplitude characteristic for resonant circuit.

11. Inductive sensor according to claim 8, wherein an amplifier characteristic of the oscillation amplifier is designed for an accelerated build-up of the oscillation of the oscillator.

12. Inductive sensor according to claim 8, wherein the sensor has a switching output and a predamping output.

* * * * *